HIGH POWER MULTI-EMITTER TRANSISTOR

Filed June 21, 1965 3 Sheets-Sheet 1

INVENTORS
JAMES H. CAVITT &
NORMAN C. TURNER
BY
Glenn H. Bonnette
Attorney

HIGH POWER MULTI-EMITTER TRANSISTOR

Filed June 21, 1965 3 Sheets-Sheet 2

INVENTORS
JAMES H. CAVITT &
BY NORMAN C. TURNER

Attorney

April 30, 1968 N. C. TURNER ET AL 3,381,183

HIGH POWER MULTI-EMITTER TRANSISTOR

Filed June 21, 1965 3 Sheets-Sheet 3

INVENTORS
JAMES H. CAVITT &
BY NORMAN C. TURNER

Attorney

United States Patent Office 3,381,183

Patented Apr. 30, 1968

3,381,183

HIGH POWER MULTI-EMITTER TRANSISTOR

Norman C. Turner, Hopatcong, and James H. Cavitt, Somerville, N.J., assignors to Radio Corporation of America, a corporation of Delaware Filed June 21, 1965, Ser. No. 465,345
7 Claims. (Cl. 317—234)

ABSTRACT OF THE DISCLOSURE

A multi-emitter, high power transistor comprises a wafer of semiconductor material having a plurality of discrete emitter regions surrounded by a base region. A base electrode comprises a grid of solder, connected to the base region, with portions surrounding, and preferably being equally spaced from, the emitter regions. A separate button of solder is connected to each emitter region. An emitter electrode comprises a metal plate connected to each of the buttons and disposed over, and spaced from, the base electrode.

This invention relates generally to semiconductor devices, and more particularly to an improved transistor and method of making it. The improved transistor is particularly useful in relatively high current (10 amperes) and high power (100 watts) electronic circuit applications.

It has been proposed to make a transistor with a plurality of discrete emitters and a high emitter periphery to emitter area ratio for high power applications. To achieve high power handling capability, an interdigitated structure of an evaporated metal and/or degenerate semiconductor material was utilized for the emitter and base contacts of the transistor. In this type of structure one set of metal fingers connects groups of the emitters in parallel, and another set of metal fingers makes connection to the base region. While such an interdigitated structure is satisfactory for transistors adapted to operate at relatively high frequencies (250 mc.) with a power output of several watts (10 watts), the drop in voltage along the fingers of the interdigitated structure produces unequal emitter-base voltages in transistors with relatively higher power (100 watts) outputs, even at frequencies below the UHF range. Such unequal emitter-base potentials in a multi-emitter, high power transistor would limit its power output and reduce its operating efficiency.

It is an object of this invention to provide a high power transistor having structural features that overcome the aforementioned disadvantages of the interdigitated structure in multi-emitter, high power transistors.

Another object of the invention is to provide an improved method of making an improved, high power transistor that is relatively smaller in size than prior art transistors of the same power output or current handling capability.

A further object of the invention is to provide an improved transistor that has a relatively lower emitter capacitance, relatively lower emitter and base series resistances, and an improved forward bias second breakdown characteristic in comparison to prior art transistors of the same power output or current handling capability.

These and other objects of the invention are obtained in an improved transistor wherein a plurality of discrete emitter regions are formed in a base region through a major surface thereof. A metallic base contact is connected to the base region, and portions of the metallic base contact surround each of the emitter regions. A metallic emitter contact is spaced from the base contact and in contact with each of the emitters. This structure provides substantially equal potentials between the base and each of the emitters of the transistor.

The novel features of the invention will be understood more fully when considered in connection with the accompanying drawings, in which similar reference characters represent similar parts throughout, and in which.

Figure 1:
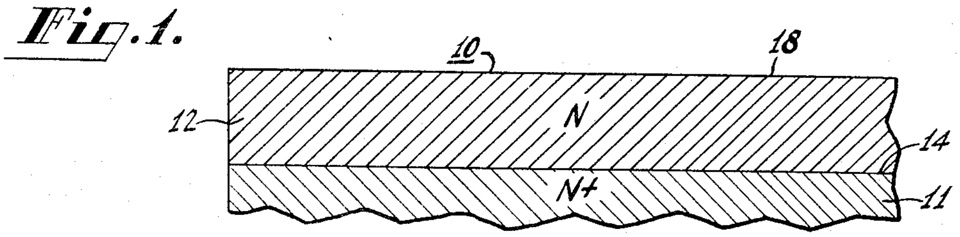
FIGS. 1–5 are fragmentary, cross-sectional views, taken along a vertical plane through a longitudinal axis of a body of semiconductor material, in different structural stages of making the improved transistor.

Referring now to FIG. 1 of the drawing, there is shown a body 10 comprising a wafer 11 of crystalline semiconductor material and a collector region, such as a layer 12 of N type semiconductor material, on a major surface 14 of the wafer 11. The exact size, shape, conductivity type, and composition of the wafer 11 is not critical. In the embodiment described, the wafer 11 is mono-crystalline silicon that is heavily doped with a donor impurity, such as phosphorus, to provide N+ type conductivity. The wafer 11 is 169 mils long, 130 mils wide, about 6 mils thick, and has a resistivity of less than 0.01 ohm-cm.

The layer 12 is an epitaxial layer of N type silicon deposited on the major surface 12 of the wafer 11 by any convenient technique known in the semiconductor art. For example, the layer 12 may be formed by passing a mixture of hydrogen and silicon chloride over the heated wafer 11. The epitaxial layer 12 thus grows as an extension of the crystal lattice of the wafer 11. The layer 12 is deposited to a thickness of about 0.5 to 4 mils and is deposited with an N type dopant to provide a resistivity in the range between 1–40 ohm-cm.

The relatively high resistivity layer 12 may also have been formed by diffusion techniques, well known in the transistor art.

Figure 2:
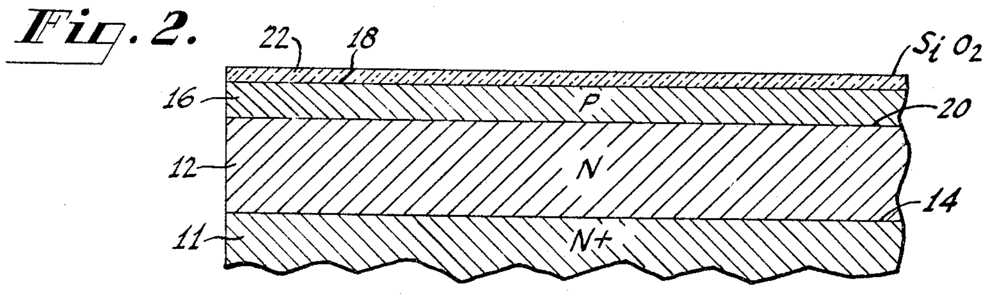

A base region, such as a base layer 16, is formed in the collector layer 12. The base layer 16 may be formed by diffusing an impurity through a major surface 18 of the collector layer 12 by any suitable diffusion technique known in the transistor art. For example, the body 10 (FIG. 1) is heated to about 1,000° C. for about 30 minutes in an ambient containing nitrogen and a suitable acceptor (P type impurity), such as boron oxide vapors. The base layer 16 is diffused to a depth of about .7 mil to form a PN junction 20 with the collector layer 12, as shown in FIG. 2.

An electrically insulating coating 22 is now deposited on the major surface 18, now a major surface of the diffused base layer 16, by any convenient method known in the semiconductor art. For example, the insulating coating 22 may comprise silicon dioxide, formed by the thermal oxidation of the base layer 16. Thus, the wafer 11, including the layers thereon, may be heated in steam for about 20 minutes at about 1,200° C. to form the layer 22 of silicon dioxide, as shown in FIG. 2.

A plurality of openings 24 (FIG. 3), preferably in a regular array, is etched through the insulating coating 22, so that a plurality of emitter regions 26 may be diffused through the exposed surface 18 of the base layer 16. The openings 24 may be etched in the insulating coating 22 with a suitable etchant, utilizing suitable photolithographic techniques well known in the semiconductor art, wherein, for example, a photoresist coating is applied to the oxide coating 22, is then exposed to a pattern of light to harden selected areas thereof, and the remaining areas then removed by a suitable solvent.

The emitter regions 26 are preferably diffused into the base layer 16 by heating the base layer 16 in an ambient including a suitable N type impurity, such as phosphorus. For example, the base layer 16 is heated in an ambient including phosphorus pentoxide for about 10 minutes at a temperature of about 1,200° C., causing the emitter regions 26 to diffuse into the base layer 16 to a depth of about .4 mil. The conductivity of the emitter regions is designated as N+ because of their relatively low resistivity compared to that of the collector layer 12.

Figure 3:
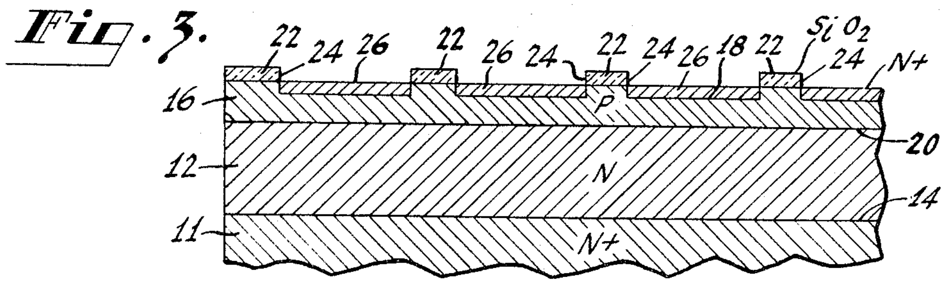
Figure 4:
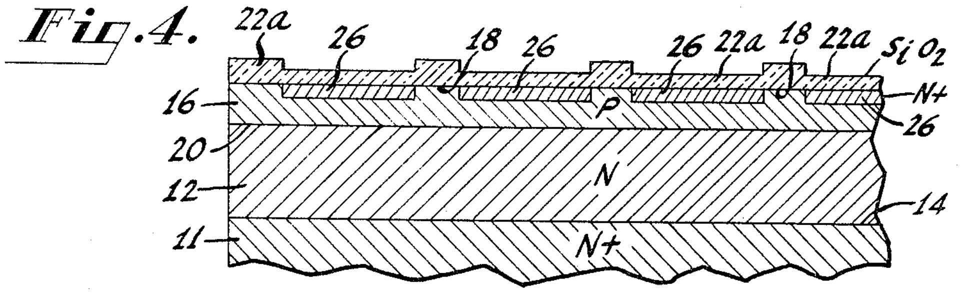

The transistor structure shown in FIG. 3 is now reheated in steam for about 20 minutes at about 1,000° C. to reform the silicon dioxide coating over the emitter regions 26. This silicon dioxide coating is combined with the aforementioned insulating coating 22, and is designated in FIG. 4 as an insulating coating *22a* The insulating coating *22a* is thicker over the base layer 16 than it is over the emitter regions 26, and thus may serve as a guide in the subsequent etching through selected portions of the insulating coating *22a*, as will hereinafter be described.

Figure 5:
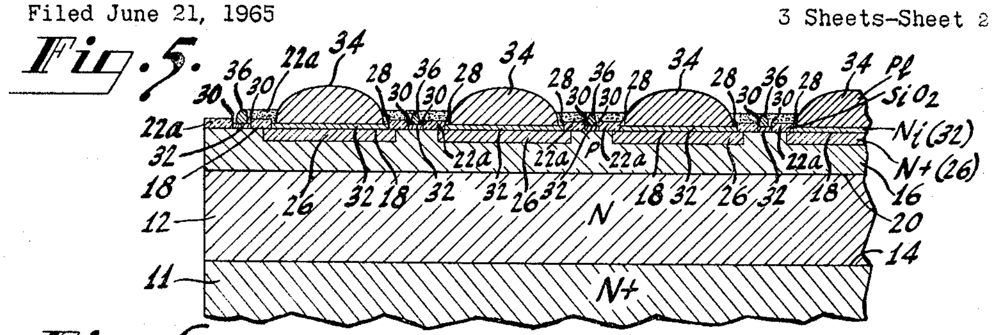
Figure 6:
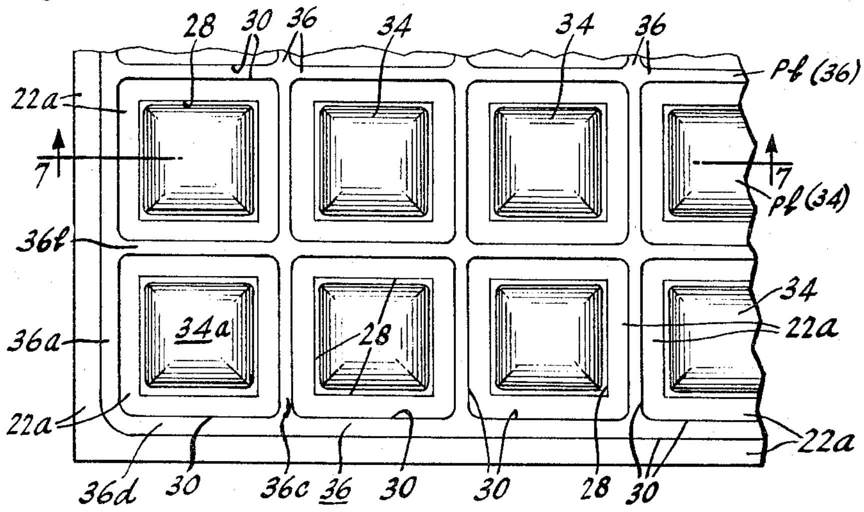
FIG. 6 is a fragmentary, plan view of the transistor structure shown in FIG. 5.

Utilizing suitable photolithographic masking and etching techniques, the silicon dioxide insulating coating *22a* is etched to provide a separate opening 28 over each of the emitter regions 26 and a series of communicating grooves 30 that surround each of the openings 28, as shown in FIGS. 5 and 6. The grooves 30 expose the major surface 18 of the base layer 16, and the openings 28 expose the emitter regions 26 diffused through the major surface 18. The edges of the insulating coating *22a* defining the grooves 30 are substantially parallel to, or equidistant from, adjacent edges of the insulating coating *22a* defining the openings 28.

The major surface 18, exposed by the openings 28 and the grooves 30, are now coated by evaporation or plating with a metal, such as nickel, as by an electroless plating process well known in the art, to produce a thin nickel coating 32 over the exposed portions of the major surface 18, as shown in FIG. 5. The coating 32 is now exposed to molten solder, as by dipping, and a separate button 34 of lead is formed over the coating 32 on the emitter regions 26, as shown in FIG. 5. In the lead dipping operation, a metallic base contact 36, in the form of a grid pattern, is also formed over the nickel coating 32 in each of the grooves 30. Solder does not adhere to those portions of the wafer which have an exposed oxide coating thereon. Thus, the base contact 36 comprises portions that are spaced from each of the emitter buttons 34. For example, the grid-like base contact 36 has portions *36a*, *36b*, *36c*, and *36d* that surrounds the emitter button *34a*, in one corner of the transistor structure, as shown in FIG. 6. The edges of the portions *36a*–*36d* of the base contact 36 are substantially parallel to the edges of the emitter button *34a* and are substantially equally spaced therefrom.

Figure 7:
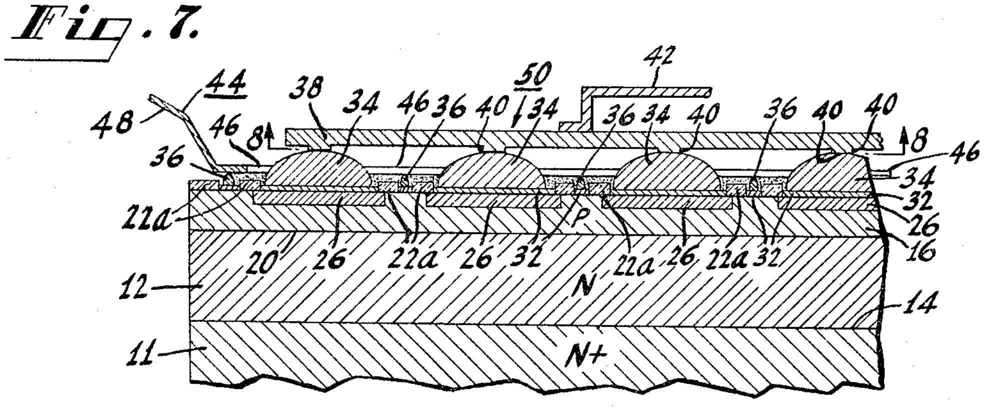
FIG. 7 is a fragmentary, cross-sectional view, taken along the line 7—7 in FIG. 6, and showing, in addition, an emitter contact member connected to a plurality of emitter buttons, and a base contact member connected to a metal grid base contact of the transistor.
Figure 8:
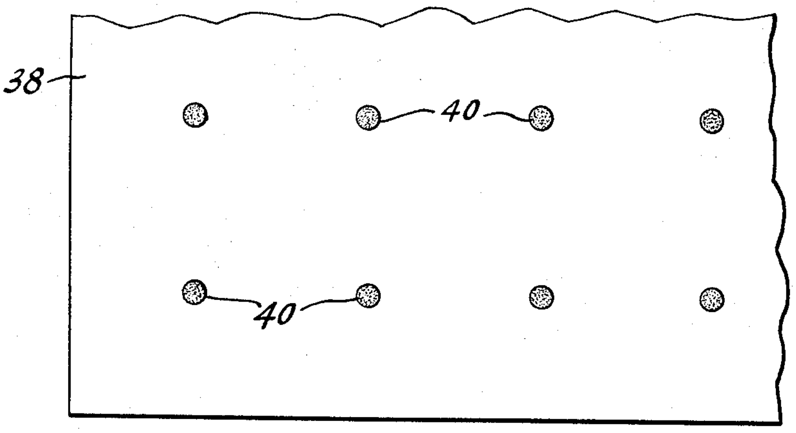
FIG. 8 is a fragmentary view of the emitter contact taken along the line 8—8 in FIG. 7.

Means are provided to connect all of the emitter regions 26 to each other, that is, in parallel. To this end, an emitter contact 38 (FIG. 7) of metal, such as copper, for example, is disposed over the base contact 36 and in contact with each of the emitter buttons 34, as shown in FIG. 7. The emitter contact 38 may have a raised portion 40 at the site where it touches each emitter button 34, as shown in FIGS. 7 and 8. The emitter contact 38 may be either contoured, dimpled, coined, formed sheet metal or may comprise a grid type material, such as wire or ribbon screen. It may also be an evaporated or sputtered layer of metal. The emitter contact 38 is electrically connected to each of the emitter buttons 34 by heating the transistor structure and the emitter contact 38 to a temperature at which the emitter buttons 34 fuse to the emitter contact 38. A metal strip 42 is soldered to the emitter contact 38 for external connecting purposes.

Figure 9:
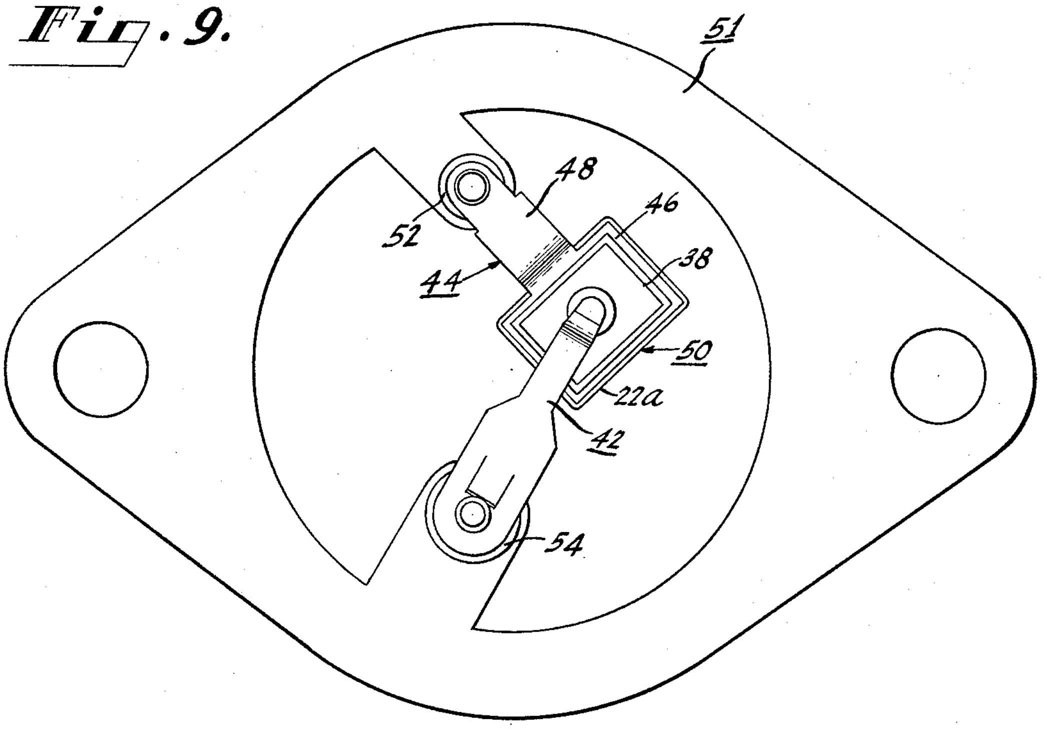
FIG. 9 is a view of the improved transistor mounted in a casing.

A strip 44 of metal, such as copper, comprises a square loop portion 46 connected to a strap portion 48, as shown in FIGS. 7 and 9. The strap portion 48 of the strip 44 is electrically connected, as by soldering, to the periphery of the base contact 36, preferably at the same time the emitter contact 38 is connected to the emitter buttons 34. A single strip of metal may also be attached to any portion of the base contact 36 to simplify the connection. Since the emitter buttons 34 are higher than any of the portions of the base contact 36, the emitter contact 38 is spaced from the base contact 36. The transistor structure shown in FIG. 7 comprises one embodiment 50 of the improved transistor.

Referring now to FIG. 9, there is shown the embodiment 50 of the transistor mounted in a casing 51 of metal. The casing 51 serves both as a heat sink and protection means for the transistor. The lower major surface of the N+ silicon wafer 11 is soldered to the casing 51 which can serve as the collector terminal for the transistor 50. The strip 44 is brought out to one side of the casing 51 and insulated therefrom by an electrical insulator 52, such as an epoxy resin, glass, or ceramic. A suitable lead (not shown) may now be soldered to the strip 44 to serve as a base lead for connection to an external circuit. The strip 42 is also fixed to the casing 51 by means of an electrical insulator 54, similar to the insulator 52, and an external lead (not shown) may be soldered to the strip 42 for external circuit connections.

While the embodiment 50 of the improved transistor has been described in terms of an NPN silicon transistor, this is by way of example only, and not limitation. The conductivity type of the various regions may be reversed, so as to fabricate improved PNP semiconductor devices. Other crystalline semiconductors, such as germanium, gallium arsenide, and the like may also be utilized with other appropriate acceptors and donors. The metal contacts may also comprise metals other than nickel, lead, and copper, and may be applied to the crystalline semiconductor material by methods other than those described. When the semiconductor material consists of materials other than silicon, such as germanium, gallium arsenide, and the like, insulating layers of silicon dioxide may be deposited thereon by the thermal decomposition of siloxane compounds, as described in U.S. Patent 3,089,793, issued May 14, 1963 to Jordan and Donahue.

The pattern of the array of the emitter buttons, as well as their shapes, may vary, and the configuration of the grid portions of the metal base contact may also vary without departing from the spirit of the invention. Although the semiconductor device described herein, for greater clarity, is in terms of a single unit made from a single body, in actual practice, a number of transistors may be processed inexpensively and simultaneously on a slice of crystal semiconductor ingot and then subdivided into separate units having uniform and reproducible electrical characteristics. Various other modifications may also be made by those skilled in the art without departing from the spirit and scope of the invention as described herein.

We claim:

1. A transistor comprising:

a collector region of one conductivity type, a base region of an opposite conductivity type and having a planar surface, a plurality of discrete emitter regions of said one conductivity type diffused into said base region adjacent said planar surface in a regular array, a separate solder button connected to each of said emitter regions at said planar surface, a metallic grid connected to said base region at said planar surface, said grid having portions completely surrounding each of said buttons and being substantially equidistant therefrom, whereby to provide a substantially similar potential between each of said emitter regions and said base region under operating conditions of said transistor, each of said buttons extending to a greater height from said base region than said grid, and
a metallic contact plate connected to each of said buttons and being disposed over, but spaced from, said metallic grid.

2. In a transistor of the type having a collector region and a base region adjacent thereto, and forming a PN junction therewith, the improvement comprising:
a plurality of discrete emitter regions adjacent to said base region, each of said emitter and said base regions having a planar surface in the same plane,
a solder button connected to each of said emitter regions at said planar surface,
a metallic plate connecting said buttons together, and
a base contact comprising a metal grid on said base region at said planar surface, said grid having portions spaced from said buttons and surrounding said buttons, said portions being substantially equidistant from said buttons and disposed between said plate and said base region.

3. A transistor comprising a semiconductor body having:
(a) a collector region and a base region forming therebetween a collector-base PN junction, said base region being disposed adjacent to an external planar surface of said body;
(b) a systematic array of spaced-apart discrete emitter regions extending from said planar surface into said base region and forming with said base region an array of separate spaced-apart base-emitter PN junctions;
(c) a grid-like base contact electrode disposed in ohmic contact with the planar surface of said base region and out of electrical contact with, and individually surrounding, each of said emitter regions; and
(d) an emitter contact electrode comprising a metal plate overlying and insulatively spaced from said grid-like base contact electrode and contacting each of said emitter regions at said planar surface.

4. A transistor comprising a semiconductor body having:
a collector region and a base region forming therebetween a collector-base PN junction, said base region being disposed adjacent to an external planar surface of said body,
an array of spaced-apart discrete emitter regions extending from said planar surface into said base region and forming with said base region an array of separate spaced-apart base-emitter PN junctions,
a metallic base electrode on said planar surface and in ohmic contact with said base region,
a separate solder button connected at said planar surface to each of said emitter regions, respectively, and
an emitter contact electrode comprising a metal plate having a surface thereof contacting each of said buttons and being disposed over, and spaced from, said external planar surface of said body.

5. In a method of making a transistor from a body comprising a collector region and a base region adjacent to said collector region, and forming a PN junction therewith, the improvement comprising:
diffusing a plurality of discrete emitter regions through a planar major surface in said base region,
coating each of said emitter regions at said major surface with a button of lead that extends to a predetermined height above said base region,
connecting a metal grid to said base region at said major surface, said metal grid having portions that completely surround each of said buttons but extend to a lesser height than said predetermined height of each of said buttons, and
connecting a metal plate electrically to each of said buttons, said metal plate being disposed over, and spaced from, said grid.

6. In a method of making a transistor from a body comprising a collector region and a base region adjacent to said collection region and forming a PN junction therewith, the improvement comprising:
diffusing an array of a plurality of discrete emitter regions in a planar major surface of said base region,
coating each of said emitter regions at said major surface with a coating of a metal,
coating said base region at said major surface with a coating of said metal in a pattern grid having portions that surround each of said emitter regions,
applying solder to said coatings to form buttons of solder on each of said emitter regions and a grid of solder, and
applying a common contact comprising a metal plate overlying said grid of solder and connected to said buttons of solder.

7. In a method of making a transistor from a body comprising a collector region and a base region adjacent to said collector region and forming a PN junction therewith, the improvement comprising:
diffusing a plurality of discrete emitter regions in a planar major surface of said base region,
coating each of said emitter regions at said major surface with a coating of nickel,
coating said major surface of said base region with a coating of nickel in a pattern having portions whose edges are equidistant from adjacent edges of said coating on said emitter region,
dipping said body in molten solder to apply solder to said coatings, whereby to form emitter buttons of solder and a base grid of solder,
applying a common-emitter contact comprising a copper plate overlying said base grid and connected to said emitter buttons, and
applying a contact having a loop portion to the periphery of said base grid.

References Cited

UNITED STATES PATENTS

| | | | |
|---|---|---|---|
| 2,778,980 | 1/1957 | Hall | 317—234.5 |
| 2,831,787 | 4/1958 | Emeis | 317—234.5 |
| 2,924,760 | 2/1960 | Herlet | 317—234.5 |
| 3,025,438 | 3/1962 | Wegener | 317—235.21 |
| 3,030,693 | 4/1962 | Faskerty | 317—235.40 |
| 3,227,896 | 1/1966 | Teszner | 317—235.21 |
| 3,234,441 | 2/1966 | Fletcher | 317—235.40 |
| 3,241,013 | 3/1966 | Evans | 317—235.22 |
| 3,275,912 | 9/1966 | Kunz | 317—235.22 |
| 3,287,612 | 11/1966 | Lepselter | 317—235.40 |
| 3,299,329 | 1/1967 | Pollock | 317—235.22 |
| 3,309,585 | 3/1967 | Forrest | 317—234.5 |

JAMES D. KALLAM, *Primary Examiner.*

JOHN W. HUCKERT, *Examiner.*

R. F. POLISSACK, *Assistant Examiner.*